(12) United States Patent
Kao et al.

(10) Patent No.: US 6,713,348 B2
(45) Date of Patent: Mar. 30, 2004

(54) METHOD FOR FORMING AN ETCH MASK DURING THE MANUFACTURE OF A SEMICONDUCTOR DEVICE

(75) Inventors: David Y. Kao, Meridian, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/293,124

(22) Filed: Nov. 12, 2002

(65) Prior Publication Data

US 2003/0077907 A1 Apr. 24, 2003

Related U.S. Application Data

(62) Division of application No. 09/677,267, filed on Sep. 26, 2000, now Pat. No. 6,479,861, which is a division of application No. 09/370,064, filed on Aug. 6, 1999, now Pat. No. 6,124,167.

(51) Int. Cl.[7] .................... H01L 21/336; H01L 21/302; H01L 21/31
(52) U.S. Cl. .................... 438/257; 438/593; 438/714; 438/717; 438/724; 438/770; 438/771; 438/947; 438/950
(58) Field of Search ................. 438/201, 211, 438/257, 593, 770, 771, 714, 717, 720, 724, 947, 950

(56) References Cited

U.S. PATENT DOCUMENTS

| | | | |
|---|---|---|---|
| 4,402,128 A | * 9/1983 | Blackstone | 438/149 |
| 4,803,181 A | 2/1989 | Buchmann et al. | 438/950 |
| 4,818,715 A | 4/1989 | Chao | 438/303 |
| 4,851,365 A | * 7/1989 | Jeuch | 438/257 |
| 4,968,552 A | 11/1990 | Linde | 428/195 |
| 5,089,867 A | 2/1992 | Lee | 357/23.5 |
| 5,149,665 A | 9/1992 | Lee | 437/43 |
| 5,192,872 A | 3/1993 | Lee | 257/315 |
| 5,241,202 A | 8/1993 | Lee | 257/315 |
| 5,260,593 A | 11/1993 | Lee | 257/316 |
| 5,281,548 A | 1/1994 | Prall | 257/315 |
| 5,343,063 A | 8/1994 | Yuan et al. | 257/319 |
| 5,429,970 A | 7/1995 | Hong | 257/316 |
| 5,444,279 A | 8/1995 | Lee | 257/316 |
| 5,595,941 A | 1/1997 | Okamoto et al. | 438/314 |
| 5,658,814 A | 8/1997 | Lee | 438/588 |
| 5,707,897 A | 1/1998 | Lee et al. | 438/257 |
| 5,750,441 A | 5/1998 | Figura et al. | 438/751 |
| 5,767,005 A | 6/1998 | Doan et al. | 438/593 |

(List continued on next page.)

OTHER PUBLICATIONS

Microelectronic Engineering 35 (1997) 41–44, "Improving the Resistance of PECVD Silicon Nitride to Dry Etching using an Oxygen Plasma" S.E. Hicks, S.K. Murad, I. Sturrock, C.D.W. Wilkinson.

*Primary Examiner*—Amir Zarabian
(74) *Attorney, Agent, or Firm*—Kevin D. Martin

(57) ABSTRACT

A method used during the formation of a semiconductor device comprises the steps of forming a polycrystalline silicon layer over a semiconductor substrate assembly and forming a silicon nitride layer over the polycrystalline silicon layer. A silicon dioxide layer is formed over the silicon nitride layer and the silicon dioxide and silicon nitride layers are patterned using a patterned mask having a width, thereby forming sidewalls in the two layers. The nitride and oxide layers are subjected to an oxygen plasma which treats the sidewalls and leaves a portion of the silicon nitride layer between the sidewalls untreated. The silicon dioxide and the untreated portion of the silicon nitride layer are removed thereby resulting in pillars of treated silicon nitride. Finally, the polycrystalline silicon is etched using the pillars as a mask. The patterned polycrystalline silicon layer thereby comprises features having widths narrower than the width of the original mask.

14 Claims, 6 Drawing Sheets

U.S. PATENT DOCUMENTS

| | | | |
|---|---|---|---|
| 5,879,992 A | 3/1999 | Hsieh et al. | 438/264 |
| 5,905,280 A | 5/1999 | Liu et al. | 257/301 |
| 5,907,775 A * | 5/1999 | Tseng | 438/261 |
| 5,923,981 A * | 7/1999 | Qian | 438/284 |
| 6,010,934 A * | 1/2000 | Wu | 438/264 |
| 6,046,086 A | 4/2000 | Lin et al. | 438/246 |
| 6,087,220 A * | 7/2000 | Rogers et al. | 438/257 |
| 6,124,167 A | 9/2000 | Kao et al. | 438/257 |
| 6,172,394 B1 * | 1/2001 | Nakagawa | 257/315 |
| 6,288,423 B1 | 9/2001 | Sugaya | 257/316 |
| 6,413,818 B1 * | 7/2002 | Huang et al. | 438/257 |
| 6,479,861 B1 | 11/2002 | Kao et al. | 257/316 |
| 2001/0000112 A1 * | 4/2001 | Lin et al. | 257/315 |

* cited by examiner

US 6,713,348 B2

METHOD FOR FORMING AN ETCH MASK DURING THE MANUFACTURE OF A SEMICONDUCTOR DEVICE

This is a division of U.S. Ser. No. 09/677,267 filed Sep. 26, 2000 and issued Nov. 12, 2002 as U.S. Pat. No. 6,479,861, which was a division of U.S. Ser. No. 09/370,064 filed Aug. 6, 1999 and issued Sep. 26, 2000 as U.S. Pat. No. 6,124,167.

FIELD OF THE INVENTION

This invention relates to the field of semiconductor processing, and more particularly to a method for forming an etch mask and exemplary uses therefor.

BACKGROUND OF THE INVENTION

During the manufacture of a semiconductor device a large number of transistors and other structures are formed over a semiconductor substrate assembly such as a semiconductor wafer. As manufacturing techniques improve and transistor density increases as feature size decreases, one manufacturing step which can create difficulties is photolithography, as there is a limit to the minimum feature size which can be formed with conventional equipment.

Various attempts have been made to overcome the limitations of conventional photolithography. For example, U.S. Pat. No. 5,750,441 by Figura et al., assigned to Micron Technology, Inc. and incorporated herein by reference in its entirety, describes various patterning techniques which have been developed in an attempt to decrease the allowable feature size using conventional lithographic equipment.

Using an oxygen plasma treatment to alter the etch characteristics of a material has been demonstrated. Hicks, et al. (S. E. Hicks, S. K. Murad, I. Sturrock, and C. D. W. Wilkinson, "Improving the Resistance of PECVD Silicon Nitride to Dry Etching Using an Oxygen Plasma," *Microelectronic Engineering*, 35, pp. 41–44, 1997) teaches the treatment of a silicon nitride layer to increase its resistance to an etch. After the silicon nitride layer is formed using plasma enhanced chemical vapor deposition, it is subjected to a treatment in a reactive ion etch chamber comprising a radio frequency power of 50 Watts, an oxygen flow rate of 25 standard cubic centimeters, and a gas pressure of 100 millitorr thereby resulting in a direct current bias of 110 volts. Hicks teaches a layer which is homogeneously densified. The etch rate of an untreated silicon nitride layer using $SF_6$ reactive ion etching was demonstrated to be up to 1,000 times greater than a treated silicon nitride subjected to the same etch conditions.

A patterning technique which can form device features smaller than those allowable by conventional photolithography equipment would be desirable.

SUMMARY OF THE INVENTION

The present invention provides a new method which decreases the minimum device feature size that can be formed with conventional photolithography equipment. In accordance with one embodiment of the invention a semiconductor substrate assembly is provided and a layer of polycrystalline silicon (poly) is formed thereover. A silicon nitride layer is formed over the poly layer, and a silicon dioxide layer is formed over the silicon nitride. The nitride and oxide layers are patterned with an etch mask having a width, thereby resulting in cross sectional sidewalls in the silicon nitride. The sidewalls of the silicon nitride are treated with an oxygen plasma which alters the etch characteristics of the silicon nitride sidewalls.

The silicon dioxide is removed, as is the untreated portion of the silicon nitride layer thereby resulting in pillars of treated silicon nitride having a width less than the width of the mask. The poly layer is etched using the silicon nitride pillars as an etch mask, thereby resulting in poly features, each of which has a width less than the width of the original etch mask.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
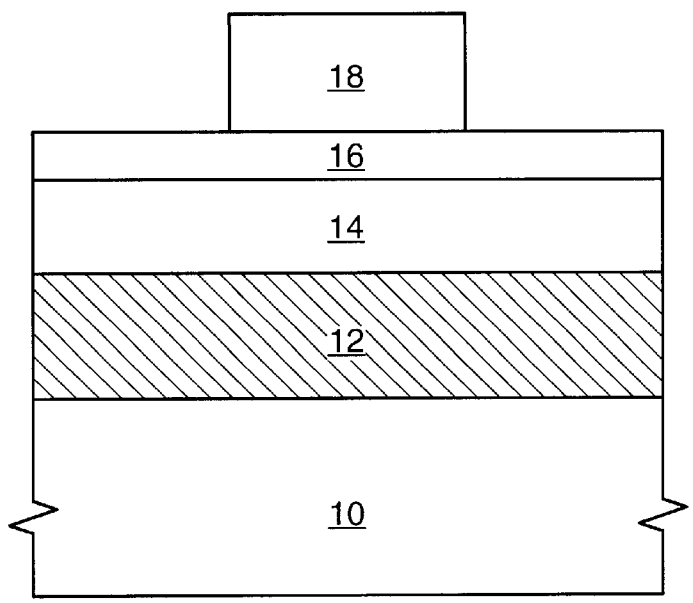
FIG. 1 is a cross section depicting a semiconductor substrate assembly having a polycrystalline silicon (poly) layer, a nitride layer, an oxide layer, and a resist layer formed thereover.

A first embodiment of the invention which decreases the device feature size that can be produced with conventional semiconductor photolithography equipment is depicted in FIGS. 1–6. FIG. 1 depicts a semiconductor wafer substrate assembly 10 which can comprise a semiconductor wafer and one or more layers, such as an overlying dielectric, depending on the use of the invention. FIG. 1 further depicts a layer 12 such as polycrystalline silicon (poly) which is to be patterned. A 2,000 angstrom (Å) poly layer can be formed in a low pressure chemical vapor deposition (LPCVD) furnace at about 620° C. in about 30 minutes using an atmosphere of silane gas ($SiH_4$), or by using another workable method.

Next, a layer of plasma enhanced (PE) silicon nitride ($Si_3N_4$) 14 is deposited by chemical vapor deposition (CVD). The deposition can be performed in an Oxford PlasmaTechnology μP80 Plus by placing the wafer substrate assembly on the grounded electrode and heating the assembly to between about 200° C. and about 600° C., preferably about 400° C. The other electrode is driven at a frequency of about 13.56 MHz with a power of between about 100 watts (W) and about 800 W, preferably about 500 W. Silane gas, for example having a purity of 99.999%, ammonia ($NH_3$) having a purity of 99.995%, and nitrogen ($N_2$) having a purity of 99.995% are each pumped into the chamber. Silane can be pumped at a flow rate of between about 5 standard $cm^3$ (sccm) and about 300 sccm, more preferably between about 10 sccm and about 100 sccm, and most preferably about 20 sccm, ammonia can be pumped at between about 5 sccm and about 300 sccm, more preferably between about 10 sccm and about 150 sccm, and most preferably about 20 sccm, and nitrogen can be pumped at a flow rate of between about 1,500 sccm and about 5,000 sccm, preferably at about 4,000 sccm. Silicon nitride forms at a rate of between about 500 Å/min and about 5,000 Å/min, and thus the process can be continued for between about 1 minute and about 10 minutes, depending on the flow rates, power, etc., to form a 5,000 Å thick layer.

Next, a layer of silicon dioxide 16 is formed using a PE tetraethyl orthosilicate (TEOS) source. For example, an $SiO_2$ layer between about 1,000 Å and about 3,000 Å thick, for example about 2,000 Å thick can, be formed by providing a supply of liquid TEOS at a temperature of between about 200° C. and about 550° C., preferably about 400° C. for about 20 seconds.

Finally, a patterned photoresist layer 18 is formed over the TEOS layer 16 using means known in the art. For purposes of illustration, the photoresist layer provided has a width which is the minimum allowable by current photolithography.

Figure 2:
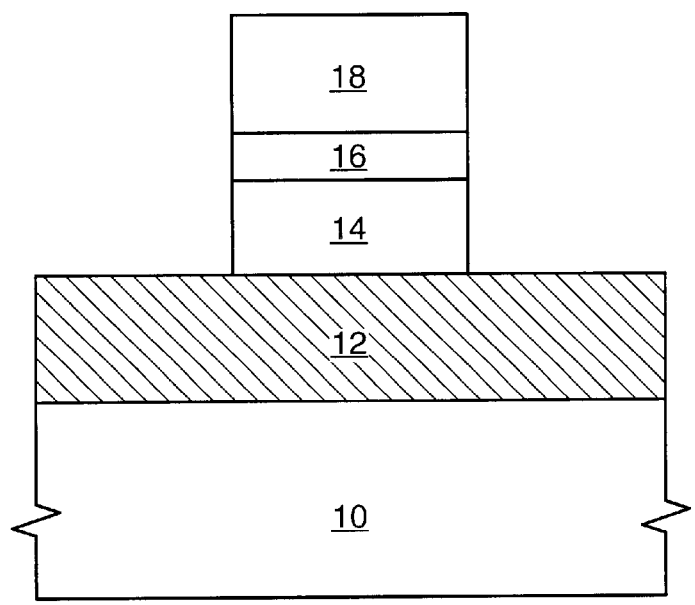
FIG. 2 is a cross section depicting the FIG. 1 structure after patterning the nitride and oxide layers.

The structure of FIG. 1 is etched with a dry anisotropic etch to result in the structure of FIG. 2. An etch which would adequately remove the $SiO_2$ layer 16 and the $Si_3N_4$ layer 14 having the thicknesses described above includes $C_4F_8$ at a flow rate of between about 5 sccm and 50 sccm, preferably between about 5 sccm and about 20 sccm, and more preferably about 10 sccm, and argon at a flow rate of between about 50 sccm and about 500 sccm, preferably about 300 sccm, for between about 20 seconds and 200 seconds, preferably about 100 seconds. This etch has a selectivity to poly, which facilitates stopping the etch on the underlying poly layer 12. In other uses of the invention where layer 12 is not poly, the etch of the FIG. 1 structure may be performed with another suitable etch which facilitates stopping on the selected layer. After etching, the resist layer 18 is removed according to means known in the art.

The structure of FIG. 2 with resist 18 removed is treated with an oxygen plasma. The structure to be treated is placed in a down flow plasma chamber. The operating conditions include a radio frequency (RF) power of between about 300 W and about 3,000 W, and more preferably between about 700 W and about 2,000 W, most preferably about 1,000 W, an oxygen flow rate of between about 50 sccm and about 5,000 sccm, preferably between about 50 sccm and about 1,000 sccm, most preferably about 200 sccm, and a gas pressure of between about 10 millitorr (mTorr) and about 1,000 mTorr, preferably about 100 mTorr for a duration of between about 1 minute and about 10 minutes for the structure described above. After the oxygen plasma treatment the structure of FIG. 3 results wherein the silicon nitride layer comprises treated areas 30 along the sidewalls and untreated areas 32 in the center where the treatment does not penetrate. The width of the treated material is self-limiting as it forms and protects the center portion of the nitride so that the center portion remains untreated. Treating the silicon dioxide does not substantially alter the etch characteristics of the material over an untreated portion.

Contrary to the process and results of Hicks et al. previously described which uses a layer treated throughout, the instant embodiment of the invention uses an untreated or minimally treated center portion. Thus a shorter duration and a lighter treatment may be used to prevent or reduce treatment of the center portion of the silicon nitride layer. In further contrast to Hicks, an overlying layer (in the instant embodiment, TEOS layer 16) reduces treatment of the center portion. It is believed that an untreated to treated etch ratio of at least 30:1 will be obtained with the process and structure as described above.

Figure 3:
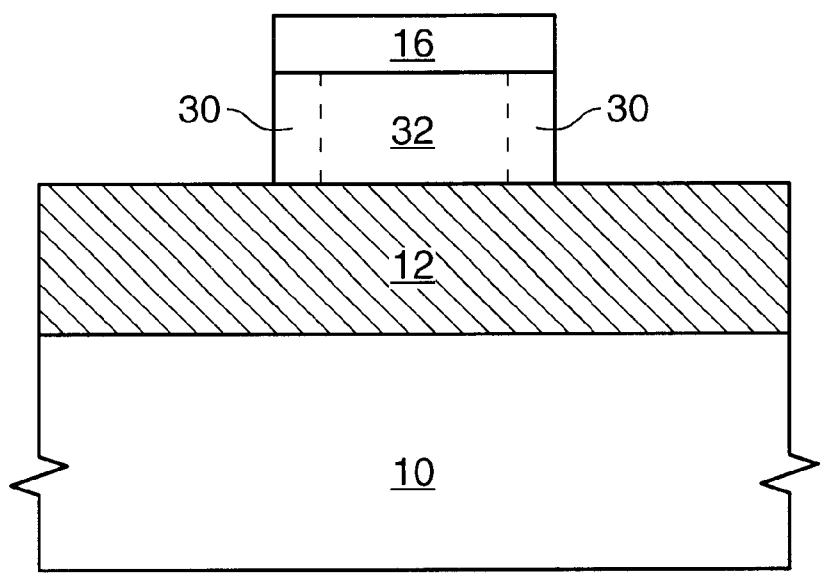
FIG. 3 depicts the FIG. 2 structure after removal of the resist layer and the treatment of the nitride with an oxygen plasma.

Subsequently, the structure of FIG. 3 is etched, for example with an anisotropic RIE etch using $SF_6$ at a flow rate of from about 5 sccm to about 50 sccm, more preferably between about 5 sccm and about 30 sccm, and most preferably about 20 sccm, an RF power of between about 50 W and about 300 W, more preferably between about 50 W and 200 W, most preferably about 100 W, and a pressure in the range of from about 10 mTorr to about 200 mTorr, more preferably from about 20 mTorr to about 200 mTorr, most preferably about 100 mTorr. Generally, increasing the pressure will decrease the etching of the treated $Si_3N_4$ and increase etching of the untreated $Si_3N_4$. Both the treated and untreated portions of the silicon dioxide layer 16 are readily etched, as is the untreated silicon nitride 32 after the oxide has been removed. Etching the oxide 16 and untreated silicon nitride 32 result in the structure of FIG. 4 including pillars of treated silicon nitride 40.

Figure 4:
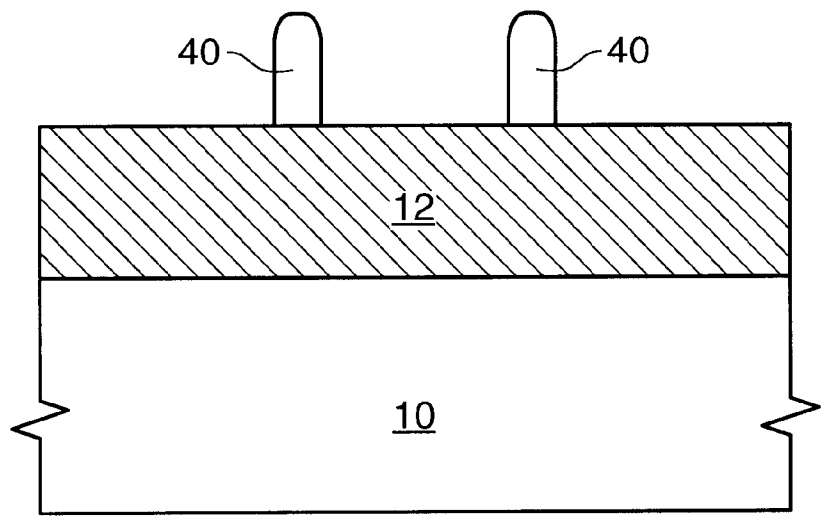
FIG. 4 depicts the FIG. 3 structure after removal of the oxide and the untreated nitride which results in pillars of treated nitride.
Figure 5:
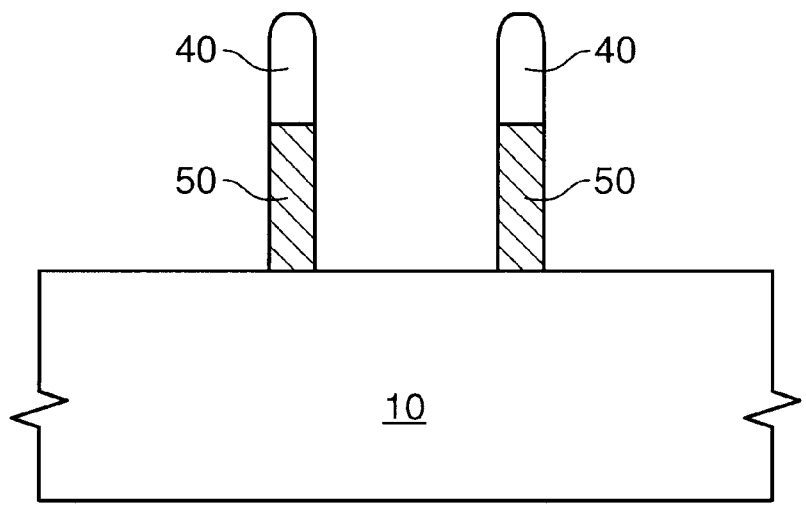
FIG. 5 depicts the FIG. 4 structure after etching of the poly layer using the pillars as a mask.

The FIG. 4 structure is subsequently etched to pattern the poly layer using the $Si_3N_4$ pillars 40 as an etch mask to result in the poly structures 50 of FIG. 5. An anisotropic etch using $Cl_2$ at a flow rate of between about 10 sccm and about 200 sccm, preferably about 80 sccm and a pressure of between about 2 mTorr and about 50 mTorr, preferably about 10 mTorr will clear most of the exposed poly. The etch characteristic can be altered to produce a more isotropic etch to ensure removal of the residual material in the narrow areas between pillars 40.

Figure 6:
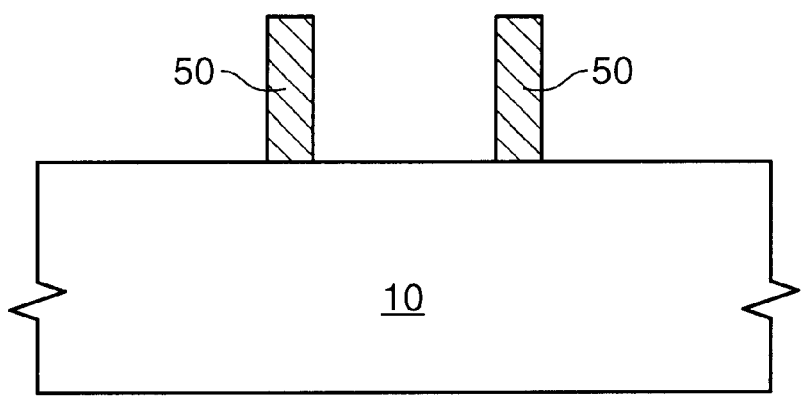
FIG. 6 depicts the FIG. 5 structure after removal of the nitride pillars.

Finally, the $Si_3N_4$ pillars 40 are removed to result in the structure of FIG. 6. A hydrofluoric acid (HF) wet etch in a 10% HF acid for between about 5 minutes and about 20 minutes will sufficiently remove the treated silicon nitride without excessively removing the poly.

It can be seen that the above process yields poly features having a width less than the width of the photoresist 18 of FIG. 1. The width of the pillars 40 depends in part on the length of time the silicon nitride is treated. For example, treating 40% of the nitride at each sidewall results in 20% untreated nitride in the center, and thus the width of the pillars will be 40% of the width of the original mask 18. Treating 25% of the nitride at the sidewalls will similarly result in pillars having a width which is 25% of the width of the original resist mask. Further, the pillars can be narrowed after their formation using an isotropic etch which etches but does not completely remove them.

Various other uses and embodiments can be determined for this process by one of ordinary skill in the art. For example, another embodiment of the invention which is used to form a floating gate memory structure is depicted in FIGS. 7–12. Floating gate memory devices such as erasable programmable read-only memories (EPROMs) electrically-erasable PROMs (EEPROMs), and flash EEPROMs are well known in the art. For example the following US Patents by Roger R. Lee, assigned to Micron Technology, Inc. and incorporated herein by reference in their entirety, describe various read-only memory cells and their methods of manufacture: U.S. Pat. No. 5,089,867 issued Feb. 18, 1992; U.S. Pat. No. 5,149,665 issued Sep. 22, 1992; U.S. Pat. No. 5,192,872 issued Mar. 9, 1993; U.S. Pat. No. 5,241,202 issued Aug. 31, 1993; U.S. Pat. No. 5,260,593 issued Nov. 9, 1993; U.S. Pat. No. 5,444,279 issued Aug. 22, 1995; U.S. Pat. No. 5,658,814 issued Aug. 19, 1997.

Figure 7:
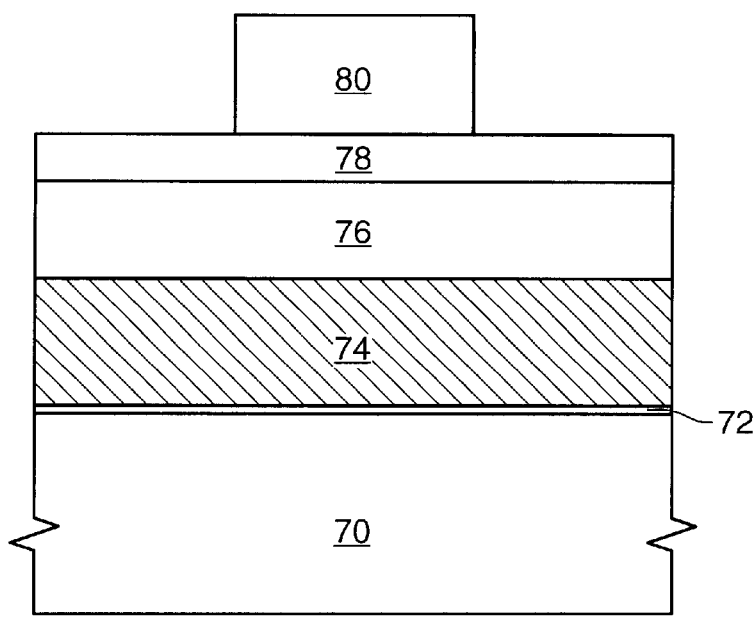
FIG. 7 is a cross section depicting a first step in the formation of a floating gate device comprising a semiconductor substrate assembly having a gate oxide, a floating gate poly, a nitride, an oxide, and a patterned resist thereover.

FIG. 7 depicts a semiconductor wafer assembly 70, a gate oxide layer 72 such as a tunnel oxide, a floating gate poly layer 74 between about 2,000 Å and about 8,000 Å thick, a silicon nitride layer 76 between about 2,000 Å and about 8,000 Å thick, a TEOS layer 78 between about 500 Å and about 2,000 Å thick, and a patterned resist layer 80. The TEOS oxide layer 78 and $Si_3N_4$ layer 76 are etched using the resist layer 80 as a pattern to result in a structure similar to that of FIG. 2. The resist layer is removed and the structure is treated with an oxygen plasma as described above for between about 3 minutes and about 30 minutes to result in the structure of FIG. 8, which comprises a $Si_3N_4$ layer having oxygen plasma treated portions 82 and an untreated portion 84.

Figure 8:
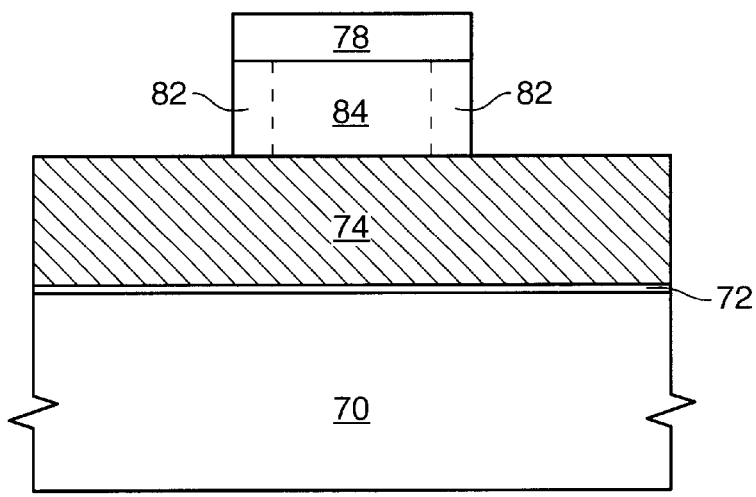
FIG. 8 depicts the FIG. 7 structure after removal of the resist and treatment of the nitride layer.
Figure 9:
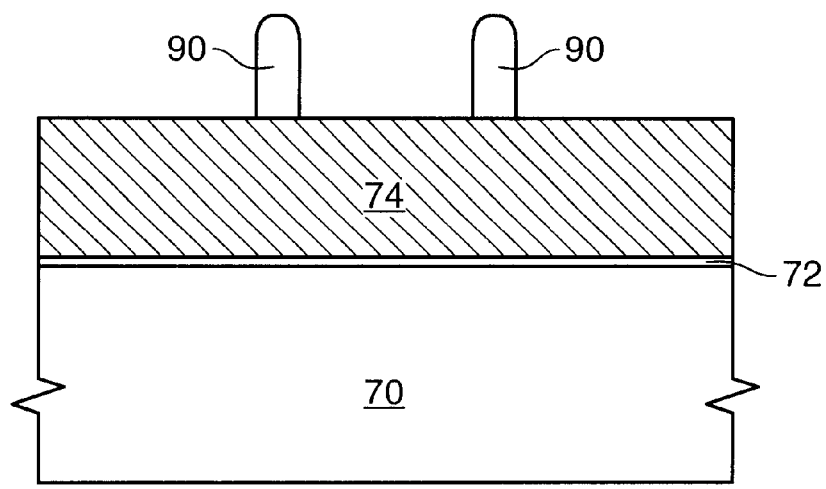
FIG. 9 depicts the FIG. 8 structure after etching of the oxide and removal of the untreated nitride.

An anisotropic etch is performed on the FIG. 8 structure to remove the TEOS layer and the untreated $Si_3N_4$ layer and to result in the structure of FIG. 9 having treated $Si_3N_4$ pillars 90. An RIE etch as described above using $SF_6$ at a flow rate of from about 10 sccm to about 30 sccm, an RF power of between about 50 W and about 500 W, and a pressure of between about 20 mTorr and about 200 mTorr would be sufficient.

Figure 10:
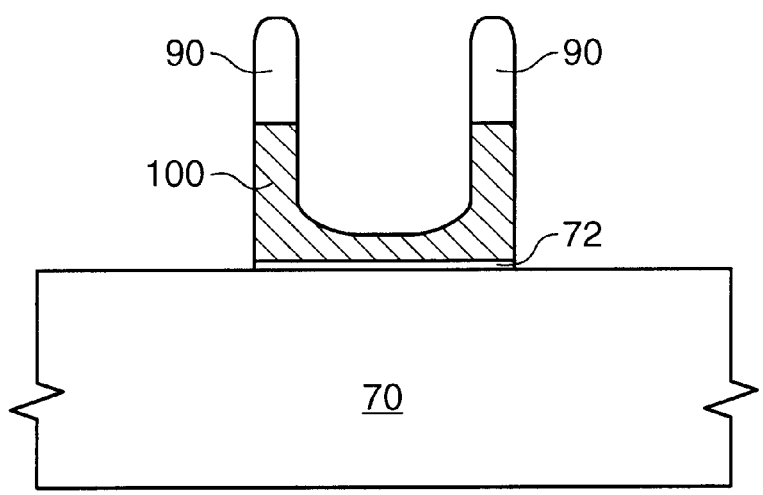
FIG. 10 depicts the FIG. 9 structure after etching of the poly layer using the pillars as an etch mask.

Next, the FIG. 9 structure is etched to result in the structure of FIG. 10 using the $Si_3N_4$ pillars 90 as an etch mask to result in the poly structure 100 of FIG. 10. In this embodiment the floating gate comprises a generally U-shaped vertical cross section. An anisotropic etch using $Cl_2$ at a flow rate of between about 10 sccm and about 200 sccm, preferably 80 sccm, and a pressure of between about 2 mTorr and about 50 mTorr for about 2 minutes will clear most of the exposed portion of an 8,000 Å poly layer and will leave a horizontally-oriented poly "stringer" bridging or spanning the two vertically-oriented poly pillars as depicted. Subsequently, the $Si_3N_4$ pillars 90 are removed, for example with a wet HF etch as described above.

Figure 11:
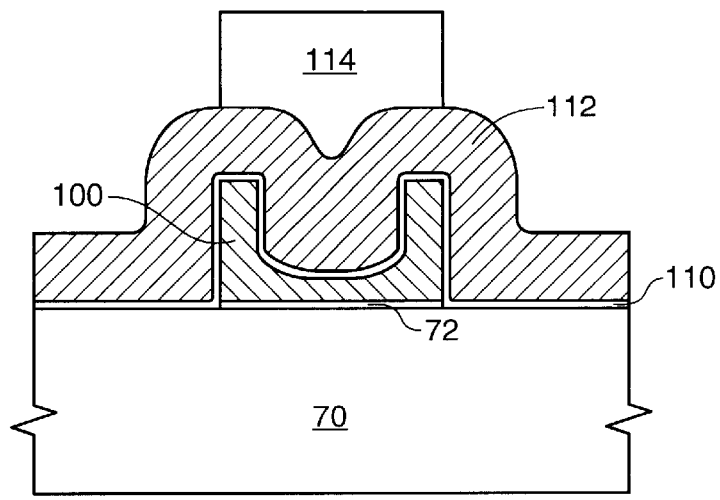
FIG. 11 depicts the FIG. 10 structure after the removal of nitride pillars, and the formation of an intergate oxide, control gate poly, and patterned resist.
Figure 12:
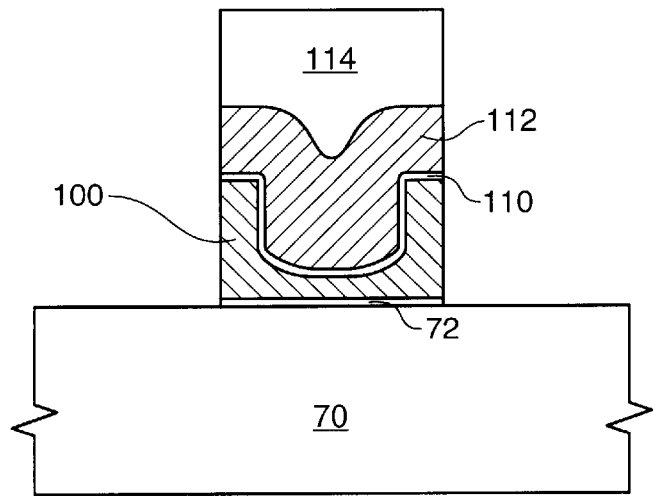
FIG. 12 depicts the FIG. 11 structure after etching the control gate poly and intergate dielectric.

As depicted in FIG. 11, an intergate dielectric layer 110, for example an oxide-nitride-oxide stack, is formed, and a control gate layer 112 is formed according to means known in the art. A layer of tungsten silicide (not depicted) can be formed according to means in the art to decrease the sheet resistance of the control gate. A patterned photoresist layer 114 is provided which will define the control gate and further define the floating gate. The FIG. 11 structure is etched to form the structure of FIG. 12, then the resist is removed. As depicted in FIG. 12, the control gate has a lower surface which is generally conformal with the floating gate. Next, wafer processing continues according to means in the art which will result in a quasi split gate memory device.

Figure 13:
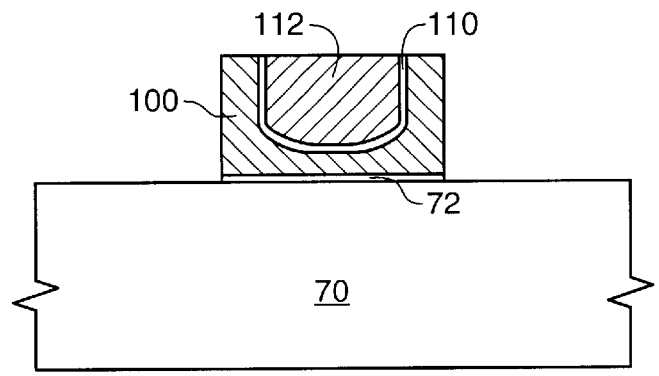
FIG. 13 depicts an alternate floating gate device.

In an alternate embodiment, the poly layer 112 of FIG. 11 is formed thick enough to impinge on itself within the concave surface formed by the floating gate. This effectively forms a thicker poly over the floating gate than between adjacent transistors. The mask 114 is omitted thereby eliminating a masking step. An anisotropic etch of the poly is performed to stop on oxide 110 and to clear the poly from between adjacent transistors. The etch is timed such that a portion of the poly 112 remains in the recess defined by the floating gate as depicted in FIG. 13. In this embodiment the floating gate and control gate each have an upper surface, and the upper surfaces are generally coplanar as depicted. Further, the floating gate has a generally concave profile and the lower surface of the control gate is conformal with the concave profile. A process using chemical mechanical polishing (CMP) can also be used to form the structure of FIG. 13 from the description herein by one of ordinary skill in the art.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising:

providing a semiconductor wafer substrate assembly comprising a semiconductor wafer;

forming a blanket first conductive layer overlying said wafer substrate assembly;

forming a blanket first mask layer overlying said blanket first conductive layer;

forming a blanket second mask layer overlying said blanket first mask layer;

patterning said blanket first and second mask layers to form first and second cross sectional sidewalls in said first and second mask layers and to form a center portion of said first mask layer which lies between said first and second sidewalls of said first mask layer, and leaving said first conductive layer unetched;

treating said first and second sidewalls of said first mask layer, said second mask layer protecting said center portion of said first mask layer such that said center portion remains untreated subsequent to treating said first and second sidewalls of said first mask layer;

removing said second mask layer;

removing said center portion of said first mask layer and leaving said first and second treated sidewalls of said first mask layer;

subsequent to removing said center portion of said first mask layer, etching said first conductive layer using said first and second treated sidewalls as a pattern to form first and second sidewalls from said first conductive layer;

subsequent to etching said first conductive layer using said first and second sidewalls as a pattern, forming a blanket second conductive layer, wherein said blanket second conductive layer impinges on itself between said first and second sidewalls of said first conductive layer and remains unimpinged in other regions overlying said semiconductor wafer substrate assembly; and removing said second conductive layer in the absence of an etch mask such that a portion of said second conductive layer remains between said first and second sidewalls of said first conductive layer and said second conductive layer is completely removed in said other regions overlying said semiconductor wafer substrate assembly.

2. The method of claim 1 further comprising:

during said etch of said first conductive layer, etching only a portion of said first conductive layer to leave a conductive stringer bridging vertically-oriented pillars such that said first conductive layer comprises a generally U-shaped vertical cross section.

3. The method of claim 1 further comprising:

during said removal of said second conductive layer in the absence of an etch mask, performing a timed anisotropic etch of said second conductive layer.

4. The method of claim 1 further comprising:

defining a transistor floating gate portion during said etch of said first conductive layer; and defining a transistor control gate portion during said removal of said second conductive layer.

5. A method used during the formation of a semiconductor device, comprising:

providing a semiconductor wafer substrate assembly comprising a semiconductor wafer;

forming a blanket first conductive layer overlying said wafer substrate assembly;

forming a blanket first mask layer overlying said blanket first conductive layer;

forming a blanket second mask layer overlying said blanket first mask layer;

patterning said blanket first and second mask layers to form first and second cross sectional sidewalls in said first and second mask layers and to form a center portion of said first mask layer which lies between said first and second sidewalls of said first mask layer, and leaving said first conductive layer unetched;

treating said first and second sidewalls of said first mask layer, said second mask layer protecting said center portion of said first mask layer such that said center portion remains untreated subsequent to treating said first and second sidewalls of said first mask layer;

removing said second mask layer;

removing said center portion of said first mask layer and leaving said first and second treated sidewalls of said first mask layer;

subsequent to removing said center portion of said first mask layer, etching said first conductive layer using said first and second treated sidewalls as a pattern to form first and second sidewalls from said first conductive layer;

subsequent to etching said first conductive layer using said first and second sidewalls as a pattern, forming a blanket second conductive layer between said first and second sidewalls of said first conductive layer;

forming a third mask layer having first and second sidewalls aligned with said first and second sidewalls of said first conductive layer; and etching said second conductive layer using said third mask layer as a pattern.

6. The method of claim 5 further comprising:

forming a transistor gate dielectric layer subsequent to etching said first conductive layer and prior to forming said blanket second conductive layer; and forming said second conductive layer such that said transistor gate dielectric layer electrically separates said first and second conductive layers.

7. A method used during the formation of a semiconductor device, comprising:

providing a semiconductor wafer substrate assembly comprising a semiconductor wafer;

forming a blanket first conductive layer overlying said wafer substrate assembly;

forming a blanket first mask layer overlying said blanket first conductive layer;

forming a blanket second mask layer overlying said blanket first mask layer;

patterning said blanket first and second mask layers to form first and second cross sectional sidewalls in said first and second mask layers and to form a center portion of said first mask layer which lies between said first and second sidewalls of said first mask layer, and leaving said first conductive layer unetched;

treating said first and second sidewalls of said first mask layer, said second mask layer protecting said center portion of said first mask layer such that said center portion remains untreated subsequent to treating said first and second sidewalls of said first mask layer;

removing said second mask layer;

removing said center portion of said first mask layer and leaving said first and second treated sidewalls of said first mask layer;

subsequent to removing said center portion of said first mask layer, etching said first conductive layer using said first and second treated sidewalls as a pattern to form first and second vertically-oriented pillars and a horizontally-oriented stringer bridging said first and second vertically-oriented pillars;

subsequent to etching said first conductive layer using said first and second sidewalls as a pattern, forming a blanket second conductive layer between said first and second sidewalls of said first conductive layer and over said horizontally-oriented stringer; and removing a portion of said second conductive layer.

8. The method of claim 7 further comprising:

forming a gate dielectric layer on said vertically-oriented pillars and on said horizontally-oriented stringer; then forming said blanket second conductive layer on said gate dielectric layer.

9. The method of claim 7 further comprising:

forming said blanket second conductive layer to have a thickness sufficient to impinge on itself within a concave surface formed by said vertically-oriented pillars and said horizontally-oriented stringer.

10. The method of claim 9 further comprising performing said removal of said portion of said blanket second conductive layer such that an upper surface of said second conductive layer does not extend above an upper surface of said vertically-oriented pillars.

11. The method of claim 10 further comprising performing chemical mechanical polishing during said removal of said portion of said blanket second conductive layer.

12. The method of claim 11 further comprising:

during said chemical mechanical polishing, removing an upper portion of said second conductive layer such that subsequent to said chemical mechanical polishing an upper surface of said first conductive layer and an upper surface of said second conductive layer are generally continuous.

13. The method of claim 11 further comprising:

forming a gate dielectric layer on said vertically-oriented pillars and on said horizontally-oriented stringer; then forming said blanket second conductive layer on said gate dielectric layer; and during said chemical mechanical polishing, removing an upper portion of said second conductive layer and an upper surface of said gate dielectric layer such that subsequent to said chemical mechanical polishing an upper surface of said first conductive layer, an upper surface of said gate dielectric layer, and an upper surface of said second conductive layer are generally continuous.

14. The method of claim 10 further comprising performing a timed etch during said removal of said portion of said blanket second conductive layer.

* * * * *